(12) United States Patent
Atzmüller et al.

(10) Patent No.: US 11,558,965 B2
(45) Date of Patent: Jan. 17, 2023

(54) DEVICE AND METHOD FOR PRODUCING AN ELECTRICAL CONNECTING CONTACT ON A COATED METAL SHEET

(71) Applicant: voestalpine Stahl GmbH, Linz (AT)

(72) Inventors: Peter Atzmüller, Linz (AT); Roland Braidt, Hellmonsödt (AT); Bernhard Jakoby, Linz (AT); Wolfgang Hilber, Gutau (AT); Johannes Sell, Linz (AT); Herbert Enser, Linz (AT)

(73) Assignee: voestalpine Stahl GmbH, Linz (AT)

( * ) Notice: Subject to any disclaimer, the term of this patent is extended or adjusted under 35 U.S.C. 154(b) by 291 days.

(21) Appl. No.: 16/627,680

(22) PCT Filed: Jun. 29, 2018

(86) PCT No.: PCT/EP2018/067620
§ 371 (c)(1),
(2) Date: Mar. 5, 2020

(87) PCT Pub. No.: WO2019/002567
PCT Pub. Date: Jan. 3, 2019

(65) Prior Publication Data
US 2020/0229310 A1    Jul. 16, 2020

(30) Foreign Application Priority Data
Jun. 29, 2017 (EP) .................................. 17178878

(51) Int. Cl.
*H05K 3/40* (2006.01)

(52) U.S. Cl.
CPC ... *H05K 3/4053* (2013.01); *H05K 2203/0126* (2013.01)

(58) Field of Classification Search
CPC .................. H05K 3/4053; H05K 2203/0126
See application file for complete search history.

(56) References Cited

U.S. PATENT DOCUMENTS

| 5,844,753 A | 12/1998 | Inaba | |
| 5,877,544 A * | 3/1999 | Rigal | G06K 19/07745 257/730 |

(Continued)

FOREIGN PATENT DOCUMENTS

| DE | 2740429 A1 | 3/1979 |
| DE | 10206440 A1 | 11/2002 |

(Continued)

*Primary Examiner* — Carl J Arbes

(57) ABSTRACT

An apparatus and a method are disclosed for producing an electric terminal contact on a coated sheet, whose coating has at least one electric conductor path covered by an electrical insulation layer, in which apparatus and method a recess is produced extending through the insulation layer at least to the electrical conductor path and in this recess, an electrically conductive contact element is provided, one end of which is electrically connected to the conductor path and at the other end of which forms the electrical terminal contact. In order to increase the reproducibility, the proposal is made for the recess to be produced with the aid of a hollow needle, which is advanced in the direction toward the conductor path and which, as it is withdrawn from the recess, introduces an electrically conductive, viscous compound into this recess in order to produce the contact element.

14 Claims, 3 Drawing Sheets

(56) References Cited

U.S. PATENT DOCUMENTS

2006/0024957 A1 2/2006 Harada et al.
2008/0113466 A1 5/2008 Moriya et al.

FOREIGN PATENT DOCUMENTS

| | | | |
|---|---|---|---|
| DE | 102008039905 A1 | | 6/2009 |
| EP | 1517597 A2 | | 3/2005 |
| FR | 2779851 A1 | * | 12/1999 |
| WO | 2002037553 A1 | * | 5/2002 |

* cited by examiner

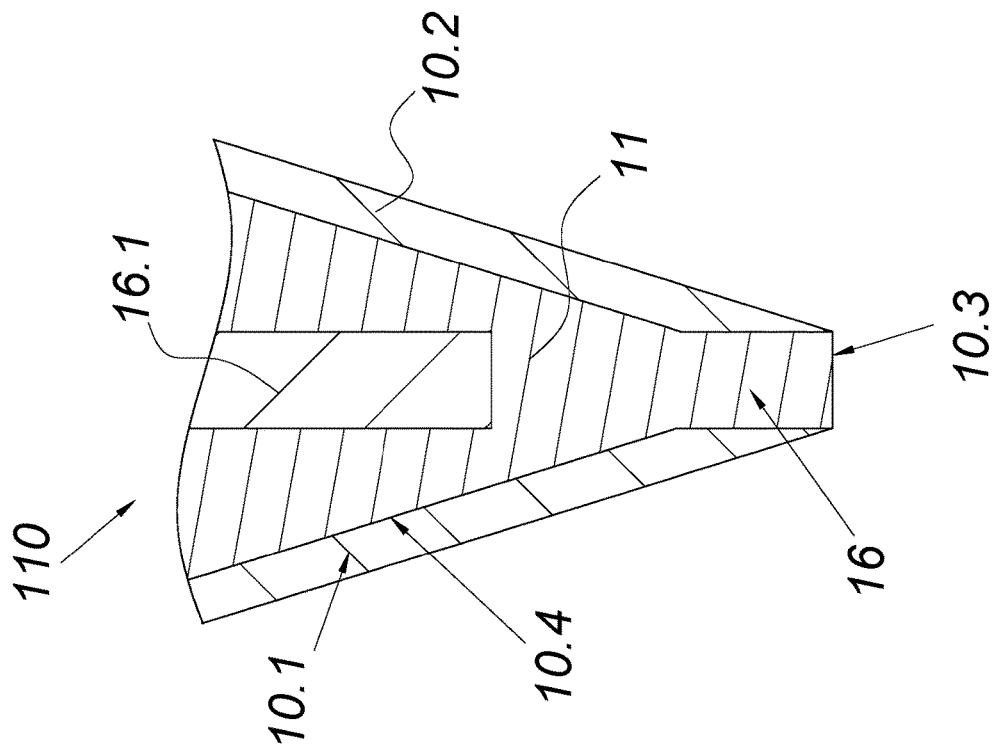
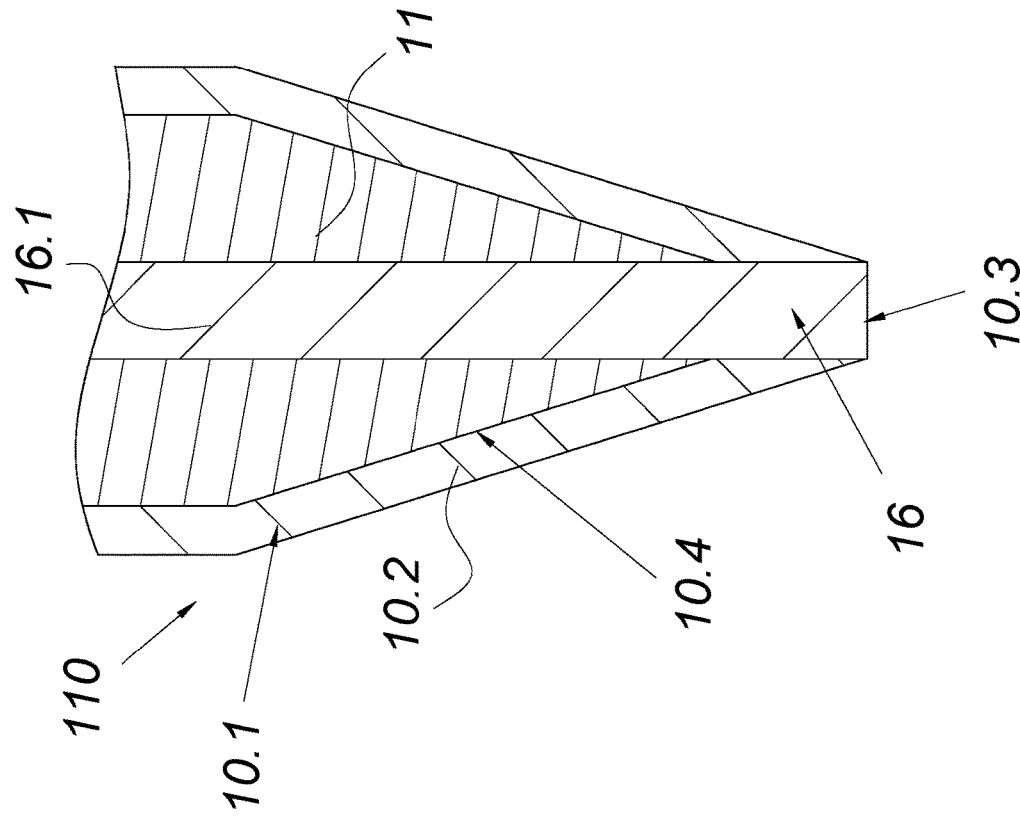

DEVICE AND METHOD FOR PRODUCING AN ELECTRICAL CONNECTING CONTACT ON A COATED METAL SHEET

FIELD OF THE INVENTION

The invention relates to an apparatus and a method for producing an electric terminal contact on a coated sheet, whose coating has at least one electric conductor path covered by an electrical insulation layer, in which method a recess is produced extending through the insulation layer at least to the electrical conductor path and in this recess, an electrically conductive contact element is provided, one end of which is electrically connected to the conductor path and the other end of which forms the electrical terminal contact.

BACKGROUND OF THE INVENTION

In order to be able to electrically connect a conductor path, which is embedded in a coating on a metal sheet, it is known from the prior art (EP1517597A2) to push a contact pin through the electrical insulation of the coating until it reaches the electrical conductor path. As a result, one end of the contact pin electrically contacts the conductor path and its other end forms the electrical terminal contact. Such a push-in installation of a contact pin can disadvantageously turn out to be comparatively difficult and imprecise to reproduce—moreover, impact-caused deformations in the contact pin can make it more difficult to achieve a precise contacting. Methods from the prior art are therefore comparatively susceptible to error.

SUMMARY OF THE INVENTION

The object of the invention, therefore, is to simplify and improve a method for producing an electric terminal contact on a coated sheet of the type described at the beginning—and thus to increase the reproducibility of the method.

The invention attains the stated object with regard to the method in that the recess is produced with the aid of a hollow needle, which is advanced in the direction toward the conductor path and which, as it is withdrawn from the recess, introduces an electrically conductive, viscous compound into this recess in order to produce the contact element.

If the recess is produced with the aid of a hollow needle, which is advanced in the direction toward the conductor path, then regardless of the mechanical strength of a contact element, a precisely positioned and comparatively exactly shaped recess in the coating can be produced, which opens the coating down to the conductor path. Among other things, this also avoids short-circuits, for example with other conductor paths. If the contact element is then provided in such a recess by virtue of the fact that the hollow needle, as it is withdrawn from the recess, introduces an electrically conductive, viscous compound into this recess in order to produce the contact element, then the exact recess can be utilized to precisely shape the contact element—and thus also to reproducibly provide an electrical connection, which is the same in its electrical properties, between the outer terminal contact and the electrical conductor path. In addition, this advancing and withdrawal of a hollow needle can be controlled in a comparatively simple way, which makes it possible to further increase the reproducibility of the method.

The reproducibility of the method can be increased further if a paste or an ink is introduced as the viscous compound.

In general, it is noted that an electrically conductive polymer such as polyaniline, polypyrrole, or polythiophene can be used as an electrically conductive paste/ink for forming the contact element. Instead of this, such a paste/ink can also have a metallic base such as silver, copper, or gold, an organic base such as PEDOT ((Poly-3,4-ethylendioxy-thiophene), or a graphene base. It is also conceivable to use carbon or graphite for this purpose. Inks/pastes with a metallic base can excel due to a particularly favorable conductivity, whereas inks and/or pastes with an organic base can mainly offer an increased corrosion resistance. A paste generally has a higher viscosity, for example>50 mPa·s, preferably >1 Pa·s, than an ink. For example, PEDOT:PSS can be produced as an ink and also as a paste. For example, this can be adjusted by means of the quantity of solvent such as water or isopropyl alcohol.

The contacting of the conductor path can be further improved if, when the hollow needle is advanced, at least one measurement variable, which depends on the distance between the hollow needle and the conductor path, is measured in order to limit the advancing depth of the hollow needle in the direction toward the sheet. It is thus possible to specify and adjust the depth of the recess in an especially precise way even with varying layer thicknesses—which in turn can increase the reproducibility of the method.

If this measurement variable, which depends on one of the permittivities between the hollow needle and the conductor path, is measured, it is then possible, for example, to reproducibly adjust the advancing depth.

It is alternatively conceivable for the advancing depth to be adjusted by measuring a measurement variable, which depends on the eddy current principle.

The advancing depth can also be adjusted exactly by measuring a measurement variable, which depends on the inductive measurement principle.

If the hollow needle pierces the electrical insulation layer, then by displacing the coating, an exact position fixing of the contact element can be assured—even with a possible shrinkage of the contact element due to curing or drying of the viscous compound.

A low-resistance contacting of the conductor path can be achieved if the hollow needle is advanced until it reaches the conductor side of the electrical conductor path that faces the sheet. This can further increase the reproducibility of the method.

A more durable electrical terminal contact can be produced if the viscous compound is dried and/or cured in order to produce a solid contact element.

The curing and/or drying of the compound in this case can take place actively or passively immediately after it is introduced. In a passive curing, for example with a silver paste, it is cured and/or dried in the air, without active acceleration of this process. Such a method step is comparatively easy to control, which can increase the reproducibility of the method. Preferably, a passive curing and/or drying can be carried out with pasty, viscous compounds, namely pastes, since they are more resistant to unwanted changes in shape of the recess, for example due to a rebounding and/or backflow of the electrical insulation layer.

An active curing and/or drying can be carried out by means of a UV irradiation or heating of the introduced conductive paste. An active curing is advantageous primarily with low-viscosity inks. In this case, for example, the viscous compound can be acted on with UV radiation immediately after being introduced and/or as the hollow needle is being withdrawn. Such an active curing and/or drying is a logical choice particularly with low-viscosity compounds such as inks since they are particularly susceptible to an unwanted shape change in the recess.

Alternatively, a thermal treatment for example with a field of infrared lamps at 40° C. to 150° C., preferably 600° C. to 100° C., in particular for 0.5 to 100 seconds and preferably for 5 to 60 seconds, can be provided in order to thus be able to accelerate the curing.

If the viscous compound is pre-dried and/or pre-cured in the hollow needle before being introduced, then this can be beneficial to the geometrical accuracy of the contact element. Such an "in-situ" curing can occur electrochemically, for example. In this connection, it is conceivable to transmit electrical energy to the hollow needle via a contact point on the conductor path, which makes it possible to stimulate the viscous compound for example in the chemical reaction for the curing. It is also conceivable for this electrical stimulation to take place in the hollow needle itself. This advantageously makes it possible to control the speed of the curing reaction in a direct, relatively simple way by regulating the current.

The geometrical accuracy of the contact element can be further improved if the viscous compound is pre-dried and/or pre-cured in such a way that this viscous compound has a hardness that increases from the inside to the outside. Furthermore, this curing to an increased degree at the boundary surface can make the method efficient and reproducible and can also further increase the dimensional stability of the introduced paste. In addition, such a pre-drying and/or pre-curing can produce a clearance between the recess and the contact element, a cavity in which electronic/electrical components/parts or other materials can be provided.

When the recess is produced with the aid of a hollow needle that is advanced in the direction toward the conductor path, if its opening is closed at the top, then it is possible to prevent impurities from getting into the hollow duct. It is thus possible to reproducibly produce a high-quality contact element in that when the hollow needle is withdrawn from the recess, its opening at the top is open, in order to introduce the electrically conductive viscous compound into this recess via this opening.

Another stated object of the invention is to produce an apparatus that is able to produce a durable electrical terminal contact on a coated sheet.

The invention attains the stated object with at least one hollow needle, which accommodates a viscous compound and has at least one sensor for detecting at least one measurement variable, which depends on the spacing distance of the hollow needle.

If the hollow needle accommodates a viscous compound and if the hollow needle has at least one sensor for detecting at least one measurement variable, which depends on the spacing distance of the hollow needle, then it is possible to achieve a comparatively simply designed means that is able to produce an electrical terminal contact in a reliable way. This measurement variable, which depends on the spacing distance of the hollow needle, can, for example, depend on the distance between the hollow needle and the conductor path, on the distance between the hollow needle and the sheet, etc.

An apparatus that enables rapid processing in the production of an electrical terminal contact on a coated sheet can be achieved if the apparatus has a plurality of parallel-guided hollow needles for jointly producing a plurality of electrical terminal contacts.

If the hollow needle has a shut-off nozzle at the opening of the head, then when the hollow needle is advanced to form the recess, it is possible to ensure a complete displacement of the material, for example of the insulation layer, in front of the hollow needle. For example, it is thus also possible to prevent material from penetrating into the hollow needle duct of the hollow needle and to prevent a negative impact on the electrically conductive, viscous compound. This can enable a more stable production of an electrical terminal contact. If in addition, a valve element of the shut-off nozzle is supported so that it is able to move in the hollow needle duct in order to open or close the opening in the head, then despite the presence of a shut-off nozzle at the head, the hollow needle can retain narrow dimensions and thus facilitate the advancing motion of the hollow needle.

BRIEF DESCRIPTION OF THE DRAWINGS

Method steps of the method according to the invention are shown by way of example in the figures. In the drawings.

DETAILED DESCRIPTION OF THE PREFERRED EMBODIMENTS

Figure 1:
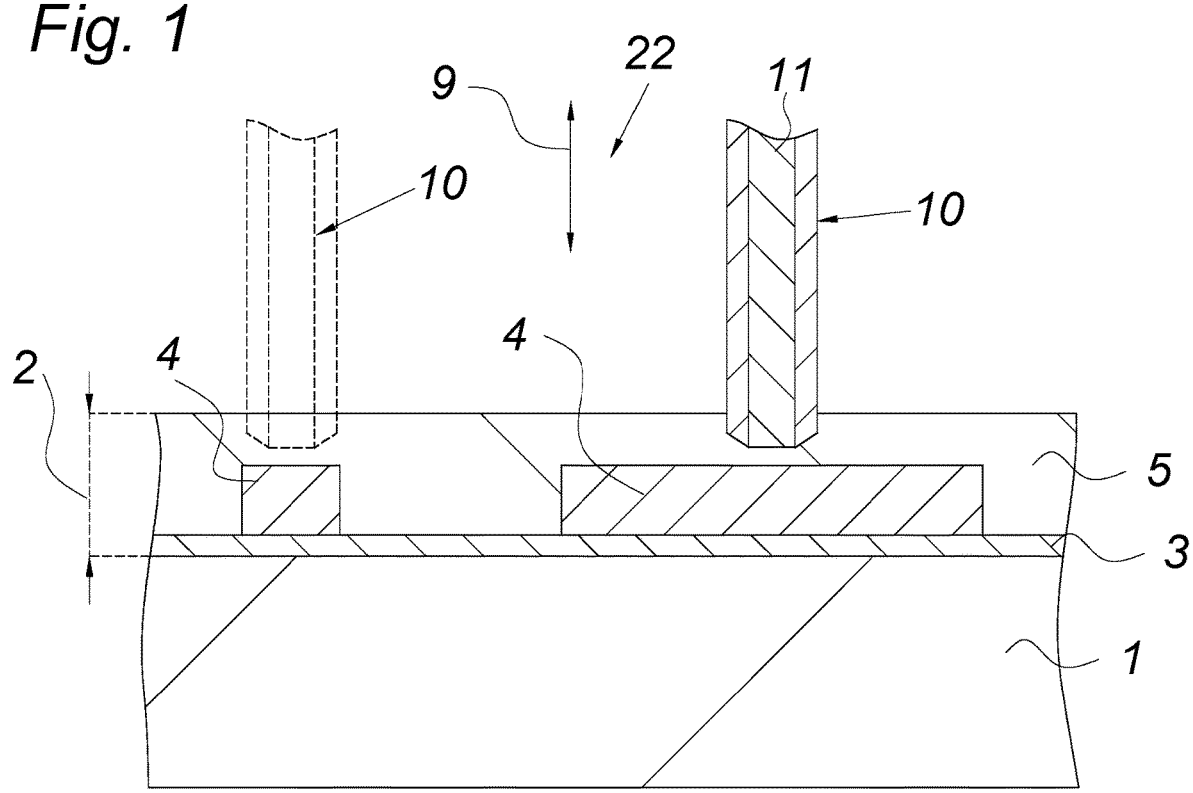
FIG. 1 shows a sectional view of a coated sheet with hollow needles pushed into its coating according to a first exemplary embodiment.
Figure 2:
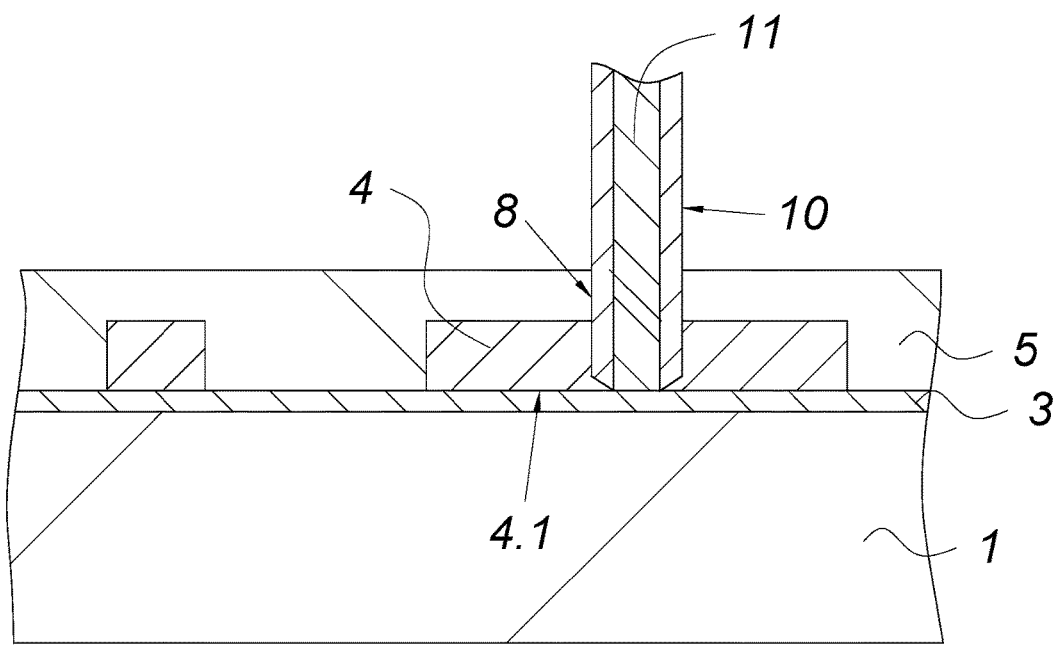
FIG. 2 shows a sectional view of the sheet shown in FIG. 1 with a retracted hollow needle.
Figure 3:
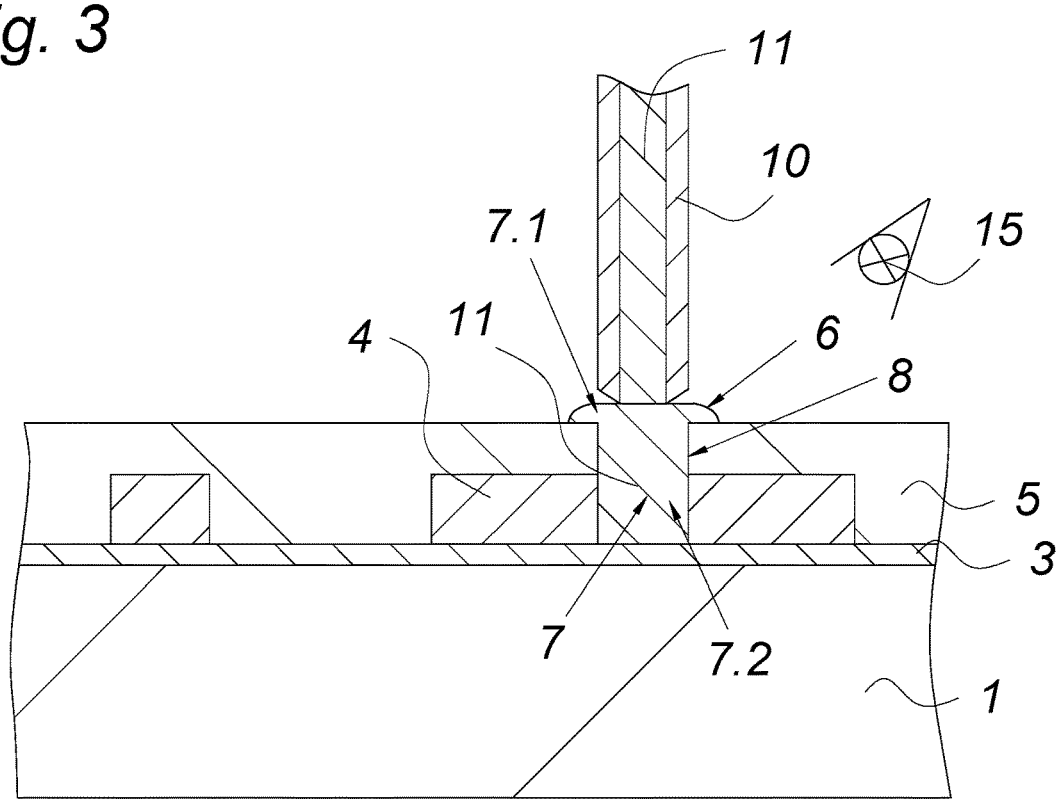
FIG. 3 shows a sectional view of the sheet shown in FIG. 1 with a terminal contact.

FIGS. 1, 2, and 3 show a sheet 1, preferably a thin sheet, in particular composed of a steel material, which sheet 1 is provided with a coating 2. This coating 2 consists of an undercoat 3 such as a primer that is applied to the sheet 1, an electrical conductor path 4 provided on the undercoat, and an electrical insulation layer 5 such as a topcoat lacquer that covers the conductor path 4 on the outside.

FIG. 3 also shows an electrical terminal contact 6 via which an electrical connection to the conductor path 4 can be produced. The electrical terminal contact 6 is composed of an electrically conductive contact element 7. For this purpose, the contact element 7 protrudes through a recess 8 in the electrical insulation layer 5 to the electrical conductor path 4 and thus contacts the conductor path 4. A first end 7.2 of the contact element 7 is thus electrically connected to the conductor path 4 and the other second end 7.1 of the contact element 7 forms the electrical terminal contact 6.

According to the invention, the recess 8 is produced in a special way, namely with the aid of a hollow needle 10 that is advanced in the direction 9 of the conductor path 4—as is clear from the exemplary embodiment shown in FIGS. 1 and 2.

Figure 4:
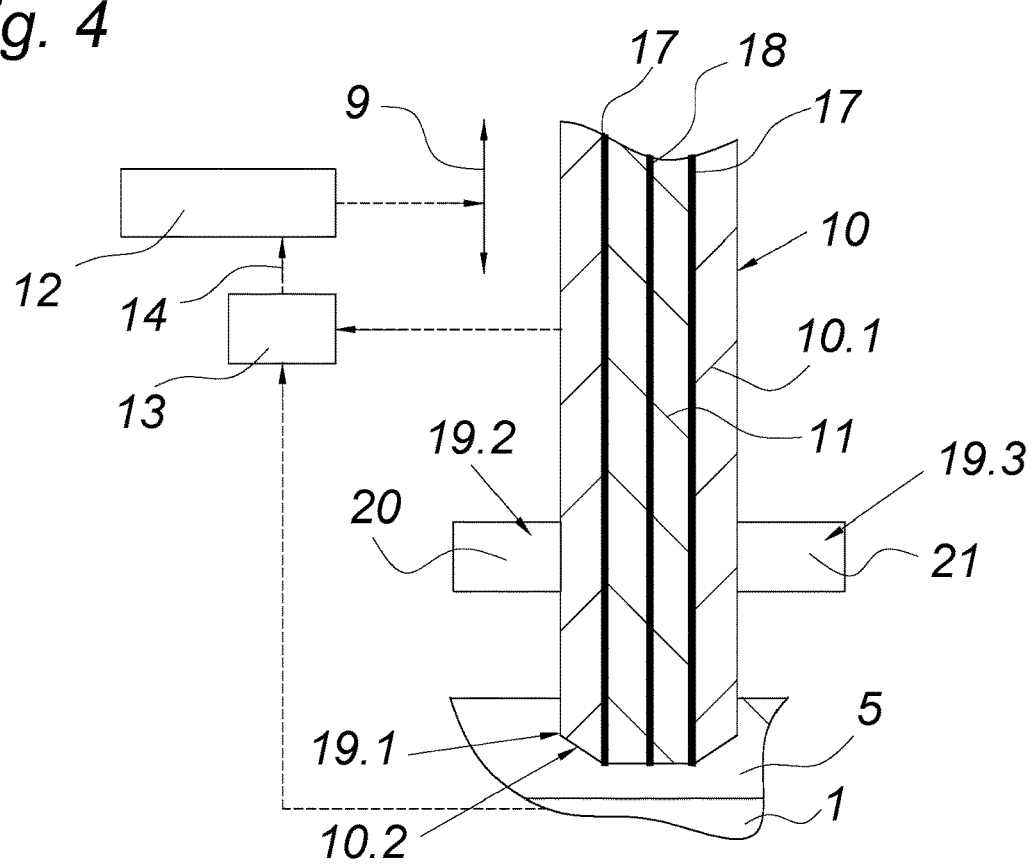
FIG. 4 shows a cut-away, enlarged sectional view of the hollow needle according to FIG. 1, and FIGS. 5a and 5b show a hollow needle according to a second exemplary embodiment.

It should be generally noted here that instead of the hollow needle 10 in FIGS. 2 to 4, it is also possible to use a hollow needle 110 shown in FIGS. 5a and 5b.

In FIG. 1, the hollow needle 10 has penetrated the coating 2—in FIG. 2, this hollow needle 10 is shown when it has already been slid far enough to reach the conductor path 4.

This insertion of the hollow needle 10 achieves a particularly exactly aligned recess 8 in the coating 2 or more precisely, the electrical insulation layer 5.

When the hollow needle 10 is withdrawn from the recess 8, the hollow needle 10 introduces into this recess 8 an electrically conductive viscous compound 11, namely a paste, which produces the solid contact element 7 in the recess 8, for example through a curing and/or drying, etc. of the compound 11. The withdrawn position of the hollow needle 10 is shown in FIG. 3.

Since the hollow needle 10 is comparatively easy to maneuver and due to the exactly aligned recess 8, it is also possible to produce an exactly positioned contact element 7 for an electrical terminal contact 6 on the coated sheet 1, the invention distinguishes itself from the prior art through a high degree of reproducibility.

In addition, in the production of the recess 8 by means of the hollow needle 10 and the introduction of the conductive viscous compound 11 into this recess 8 as the hollow needle 10 is withdrawn, the method can be carried out continuously, which accelerates it and also makes it more efficient.

The penetration depth of the hollow needle 10 into the coating 2 is adjusted by a control unit 12, which regulates/controls the advancing motion 9 of the hollow needle 10. For this purpose, the control unit 12 is associated with a measuring device 13, which sends the control unit 12 a measurement variable 14 that depends on one of the permittivities between the hollow needle 10 and the sheet 1. By means of this measurement, which can for example be a capacitance measurement using the electrically conductive casing 10.1 of the hollow needle 10 as a sensor 19.1, it is possible to determine the distance of the hollow needle tip from the sheet 1—making it possible to limit and exactly adjust the advancing depth of the hollow needle 10 in the direction toward the sheet 1.

Alternatively or in addition to this capacitively acting first sensor 19.1 of the hollow needle 10 according to FIG. 4, it is also conceivable for the hollow needle 10 to have sensors 19.2, 19.3 that act inductively and/or in accordance with the eddy current principle, as indicated in FIG. 4, in order to be able to perform the distance measurement in a reliable way.

For this purpose, the hollow needle according to FIG. 4 has a first electrical coil 20 as a second sensor 19.2, which first coil 20 is mounted to the outside of the casing 10.1 of the hollow needle 10. With the aid of this first coil 20, eddy currents are induced in the conductor path and/or sheet. Based on the change in the impedance of the first coil 20, the electromagnetic shielding of the sheet 1 by the overlying conductor path 4 can be detected and as a result of this, it is possible to draw a conclusion about the distance of the hollow needle 10 from the conductor path 4.

Alternatively or additionally, the hollow needle 10 can have a second electrical coil 21 as a third sensor 19.3 provided on the outside of the casing 10.1. In this measuring method, the first coil 20 is used to generate a magnetic field. The second coil 21 is used to measure a voltage that is proportional to the magnetic flux generated by the first coil 20. Since the conductor path 4 embedded in the coating 2 causes a change in the magnetic flux to occur, the voltage in the second coil 21 can be used to detect the covered conductor path and also to calculate the distance of the hollow needle 10 from the conductor path 4.

As shown in FIGS. 1 and 2, the hollow needle 10 penetrates the electrical insulation layer 5 in order to form the recess 8. But it is also conceivable for the hollow needle 10 to use a material-removing method in order to produce the recess 8. For this purpose, the hollow needle 10 can have at least one cutting blade, not shown in detail, for example in the form of a disposable cutting insert. The cutting blade that is not shown in detail can be provided in accordance with FIG. 4 or FIG. 5a on the casing 10.1 and/or on the head 10.2 of the hollow needle 10 in order to remove material from the electrical insulation layer 5.

A reliable electrical contact with a low resistance is achieved by inserting the hollow needle 10 down to the conductor side 4.1 of the electrical conductor path 4 facing the sheet 1.

The viscous compound 11 is cured using a radiation source 15, namely a UV lamp, which produces a solid and thus dimensionally stable contact element 7. Alternatively or in addition to the UV lamp, a thermal radiation source such as an IR lamp array can be provided. The solidification (for example: drying, curing, chemical cross-linking, etc.) of the viscous compound 11 can be carried out during and/or after the introduction of the viscous compound 11 into the recess 8. It is also conceivable for the solidification of the viscous compound 11 to take place in a method step following the production of an electrical terminal contact 6.

Furthermore—as shown in detail in FIG. 4—before being introduced, the viscous compound 11 can be pre-solidified in the hollow needle 10, namely through cross-linking. For this purpose, the hollow needle has an electrically insulating coating 17 on the inside of the casing 10.1. In addition, an electrode 18, for example Pt wire, is provided in the center of the hollow needle 10, which cooperates as a counter electrode with the electrically conductive casing 10.1, in order to promote a chemical curing reaction (for example: polymerization) in the viscous compound 11 when electrical energy is applied between the two electrodes. It is thus possible to already perform an in-situ curing of the viscous compound 1 before it is introduced into the recess 8. In particular, it is thus possible to pre-dry and/or pre-cure the viscous compound 11 in such a way that this compound 11 has a hardness that increases from the inside to the outside.

An apparatus 22 for the parallel production of a plurality of electrical terminal contacts 6 is also shown in FIG. 1. Here, a plurality of hollow needles 10 are guided in parallel fashion by the apparatus 22, specifically with the same advancing motion 9. The hollow needles 10 are spaced apart from one another in the sheet 1, for example one after another and next to one another and can thus produce, for example, the terminal contacts 6 of an electrical interface that is not shown in detail. This can produce an interface in a rapidly processed way that is easy to control and efficient.

In general, it should also be noted that the shape of the hollow needle can be blunt or can taper to a point. With a blunt penetration, the electrical insulation layer is subjected to the lowest possible stress, whereas with a shape that tapers to a point, it is possible to reduce the penetration force. Furthermore, a blunt shape can facilitate the detection of measurement data and can thus make the method more precise.

As shown in FIGS. 5a and 5b, the hollow needle 110 according to a second embodiment has a shut-off nozzle 16 on the head 10.2. This shut-off nozzle 16 is used to open and close the opening 10.3 in the head 10.2 of the hollow needle 110. This is made possible by a plunger-shaped valve element 16.1 of the shut-off nozzle 16, which valve element 16.1 is positioned so that it is able to move in linear fashion in the hollow needle duct 10.4. When the shut-off nozzle 16 is closed, the valve element 16.1 closes the opening 10.3 in the head 10.2 in a precisely fitting way and when the shut-off nozzle 16 is open, the valve element 16.1 is retracted relative to the opening 10.3 and thus enables the flow for the electrically conductive, viscous compound 11. This prevents an internal contamination of the hollow needle 110 and its electrically conductive, viscous compound 11, for example when the hollow needle 110 is being slid through a material in order to produce the recess 8. The hollow needle 110 according to the invention therefore always ensures production of a high-quality electrical terminal contact 6, which particularly increases the stability of the method.

The invention claimed is:

1. A method for producing an electric terminal contact on a coated sheet, whose coating has at least one electric conductor path covered by an electrical insulation layer, the method comprising:

producing a recess extending through the insulation layer at least to the electrical conductor path;

providing an electrically conductive contact element in the recess, with one end of the electrically conductive contact element electrically connected to the conductor path and another end of the electrically conductive contact element forming the electrical terminal contact; and providing at least one hollow needle, which accommodates a viscous compound and has at least one sensor for detecting at least one measurement variable, which depends on a distance from the hollow needle to the electrical conductor path;

wherein the recess is produced with the aid of the at least one hollow needle, which is advanced in a direction toward the conductor path as a result of measuring the measurement variable in order to limit an advancing depth of the hollow needle in a direction toward the sheet and, as the hollow needle is withdrawn from the recess, the hollow needle introduces the electrically conductive, viscous compound into the recess in order to produce the contact element.

2. The method according to claim 1, wherein a paste or an ink is introduced as the viscous compound.

3. The method according to claim 1, wherein the at least one measurement variable depends on a permittivity between the hollow needle and the conductor path.

4. The method according to claim 1, wherein the at least one measurement variable depends on the eddy current principle.

5. The method according to claim 1, wherein the at least one measurement variable depends on the inductive measurement principle.

6. The method according to claim 1, wherein the hollow needle pierces the electrical insulation layer.

7. The method according to claim 1, wherein the hollow needle is advanced until the hollow needle reaches a conductor side of the electrical conductor path that faces the sheet.

8. The method according to claim 1, wherein the viscous compound is dried and/or cured in order to produce a solid contact element.

9. The method according to claim 8, wherein the viscous compound is pre-dried and/or pre-cured in the hollow needle before being introduced into the recess.

10. The method according to claim 9, wherein the viscous compound is pre-dried and/or pre-cured in such a way that the viscous compound has a hardness that increases from an inside of the viscous compound to an outside of the viscous compound.

11. The method according to claim 1, wherein when the recess is produced with the aid of the hollow needle that is advanced in the direction toward the conductor path, an opening of the needle is closed at a top of the needle and when the hollow needle is withdrawn from the recess, the opening at the top is open in order to introduce the electrically conductive viscous compound into the recess so as to produce the contact element.

12. An apparatus for carrying out the method according to claim 1, the apparatus comprising at least one hollow needle, which accommodates a viscous compound and has at least one sensor for detecting at least one measurement variable, which depends on a distance from the hollow needle to the electrical conductor path.

13. The apparatus according to claim 12, wherein the apparatus has a plurality of parallel-guided hollow needles for jointly producing a plurality of electrical terminal contacts.

14. The apparatus according to claim 12, wherein each of the at least one hollow needles has a shut-off nozzle at an opening of a head of the needle; a valve element of the shut-off nozzle is supported so that the valve element is able to move in a duct of the hollow needle in order to open or close the opening in the head.

\* \* \* \* \*

UNITED STATES PATENT AND TRADEMARK OFFICE
CERTIFICATE OF CORRECTION

| | | |
|---|---|---|
| PATENT NO. | : 11,558,965 B2 | Page 1 of 1 |
| APPLICATION NO. | : 16/627680 | |
| DATED | : January 17, 2023 | |
| INVENTOR(S) | : Peter Atzmuller et al. | |

It is certified that error appears in the above-identified patent and that said Letters Patent is hereby corrected as shown below:

In the Specification

Column 3, Line 4, "600° C." should read --60° C.--.

Signed and Sealed this
Twenty-first Day of May, 2024

*Katherine Kelly Vidal*

Katherine Kelly Vidal
*Director of the United States Patent and Trademark Office*